(12) United States Patent
Watanabe et al.

(10) Patent No.: US 6,737,942 B2
(45) Date of Patent: May 18, 2004

(54) SURFACE ACOUSTIC WAVE APPARATUS AND COMMUNICATION APPARATUS

(75) Inventors: Hiroki Watanabe, Ishikawa-ken (JP); Yuichi Takamine, Kanazawa (JP)

(73) Assignee: Murata Manufacturing Co., LTD, Kyoto (JP)

(*) Notice: Subject to any disclaimer, the term of this patent is extended or adjusted under 35 U.S.C. 154(b) by 0 days.

(21) Appl. No.: 10/122,352

(22) Filed: Apr. 16, 2002

(65) Prior Publication Data

US 2002/0175783 A1 Nov. 28, 2002

(30) Foreign Application Priority Data

Apr. 16, 2000 (JP) .................................. 2001-117376
Dec. 3, 2001 (JP) .................................. 2001-368285

(51) Int. Cl.$^7$ .............................................. H03H 9/64
(52) U.S. Cl. ..................................... 333/193; 333/195
(58) Field of Search ................................. 333/193–196

(56) References Cited

U.S. PATENT DOCUMENTS 5,874,868 A    2/1999   Shimoe ................... 333/193
6,501,208 B1 * 12/2002  Kuroda .................. 310/313 R
2002/0017969 A1 * 2/2002 Takamine ................ 333/193

FOREIGN PATENT DOCUMENTS

| JP | 63135010 A | * | 6/1988 | ............ H03H/9/25 |
| JP | 05-267990 |   | 10/1993 | |
| JP | 7-046077 A |   | 2/1995 | |
| JP | 9-2838047 |   | 9/1997 | |

* cited by examiner

Primary Examiner—Terry D. Cunningham
Assistant Examiner—Quan Tra
(74) Attorney, Agent, or Firm—Keating & Bennett, LLP

(57) ABSTRACT

A surface acoustic wave apparatus includes a plurality of interdigital transducers arranged in a longitudinally-coupled-resonator manner. The interdigital transducers are located adjacent to each other, and the pitch of an electrode finger located in an end portion of an IDT is made smaller than that of electrode fingers at the other portions in the interdigital transducers, and the duty of the electrode finger of which the pitch has been made smaller is smaller than that of the electrode fingers at the other portions.

14 Claims, 14 Drawing Sheets

Resonant Mode Corresponding
To Point B (O-TH Order Mode)

Resonant Mode Corresponding
To Point A (Second Order Mode)

Resonant Mode Corresponding
To Point C

SURFACE ACOUSTIC WAVE APPARATUS AND COMMUNICATION APPARATUS

BACKGROUND OF THE INVENTION

1. Field of the Invention

The present invention relates to surface acoustic wave apparatuses, such as a longitudinally-coupled-resonator-type surface acoustic wave filter in which a plurality of interdigital transducers (hereinafter called IDTs) each having a plurality of electrode fingers are arranged in a direction in which a surface acoustic wave propagates, and also relates to communication apparatuses including such surface acoustic wave apparatuses.

2. Description of the Related Art

Surface acoustic wave filters (surface acoustic wave apparatuses) are widely used as bandpass filters in RF stages of portable telephones. The performance required for the bandpass filters includes a low loss, a high attenuation, and a wide bandwidth. Many surface acoustic wave filters satisfying the performance have been invented.

Among these surface acoustic wave filters, as a method for extending the bandwidth of a longitudinally-coupled-resonator-type surface acoustic wave filter, a method has been widely used in which the arrangement of resonant modes is optimized by a condition in which electrode fingers are arranged periodically through two adjacent IDTs, more specifically, by shifting the distance between the centers of adjacent electrode fingers positioned across the space between two adjacent IDTs from half the wavelength determined by the pitch of electrode fingers, such as that disclosed, for example, in Japanese Unexamined Patent Publication No. 05-267990.

In the conventional method, although the bandwidth of a filter can be extended, an insertion loss deteriorates.

In other words, when the distance between adjacent electrode fingers positioned across the space between two adjacent IDTs is shifted from half the wavelength determined from the pitch of electrode fingers, periodic continuity deteriorates in a propagation path of a surface acoustic wave at that portion. Especially in a surface acoustic wave filter including a piezoelectric substrate which uses a leaky surface acoustic wave, such as a 36-degree Y-cut X-propagation LiTaO$_3$ substrate or a 64-degree Y-cut X-propagation LiNbO$_3$, a loss caused by the emission of a bulk wave increases. As a result, although the bandwidth of the filter is extended, an insertion loss (propagation loss) deteriorates.

SUMMARY OF THE INVENTION

In order to overcome the problems described above, preferred embodiments of the present invention provide a longitudinally-coupled-resonator-type surface acoustic wave apparatus which has a wide pass bandwidth, has a small insertion loss and a small VSWR, and does not cause deterioration of the dielectric strength, and for which electrodes are easily formed, and to provide a communication apparatus which includes such a novel surface acoustic wave apparatus.

According to one preferred embodiment of the present invention, a surface acoustic wave apparatus of a longitudinally-coupled-resonator type includes a plurality of interdigital transducers each having a plurality of electrode fingers, arranged along the propagation direction of a surface acoustic wave on a piezoelectric substrate, wherein the pitch of an electrode finger located in an end portion facing another interdigital transducer is smaller than that of electrode fingers at the other portions in at least one interdigital transducer, and the duty (also called a metallization ratio) of the electrode finger of which the pitch is made smaller is smaller than that of the electrode fingers at the other portions.

According to the above-described unique structure, in a longitudinally-coupled-resonator-type surface acoustic wave filter having a plurality of interdigital transducers, the pitch of an electrode finger located in an end portion where two IDTs face each other is smaller than that of electrode fingers at the other portions in the IDT, and the duty of the electrode finger (hereinafter called a narrow-pitch electrode finger) of which the pitch has been made smaller is smaller than that of electrode fingers at the other portions. Therefore, the filter has a bandwidth that is substantially equal to or wider than that obtained by a conventional technology, has a small insertion loss, does not cause deterioration of the dielectric strength, and its electrodes are easily formed.

In the above-described surface acoustic wave apparatus, it is preferred that both IDTs adjacent to each other be provided with an electrode finger having a different pitch, and the distance between the centers of adjacent electrode fingers positioned across the space between two IDTs be made substantially equal to about 0.5λI$_2$, where λI$_2$ indicates the wavelength determined by the pitch of the electrode fingers of which the pitch has been made different, and λI$_1$ indicates the wavelength determined by the pitch of the other electrode fingers.

According to the above-described unique structure, when both IDTs adjacent to each other are provided with an electrode finger having a different pitch, the distance between the centers of adjacent electrode fingers positioned across the space between two IDTs is made almost equal to 0.5λI$_2$. Therefore, since the continuity of a surface acoustic wave propagating between the IDTs is ensured, the deterioration of an insertion loss is reliably prevented.

In the above-described surface acoustic wave apparatus, it is further preferred that one of IDTs adjacent to each other be provided with an electrode finger having a different pitch, and the distance between the centers of adjacent electrode fingers positioned across the space between two IDTs be made almost equal to 0.25λI$_1$+0.25λI$_2$, where λI$_2$ indicates the wavelength determined by the pitch of the electrode finger of which the pitch has been made different, and λI$_1$ indicates the wavelength determined by the pitch of the other electrode fingers.

According to the above-described unique structure, when one of IDTs adjacent to each other is provided with an electrode finger having a different pitch, the distance between the centers of adjacent electrode fingers positioned across the space between two IDTs is made almost equal to 0.25λI$_1$+0.25λI$_2$. Therefore, since the continuity of a surface acoustic wave propagating between the IDTs is ensured, the deterioration of an insertion loss is reliably prevented.

In the surface acoustic wave apparatus, it is further preferred that, in the interdigital transducer in which the pitch of the electrode finger located in the end portion facing the another interdigital transducer is made different from that of the other electrode fingers in the interdigital transducer, the distance between the centers of adjacent electrode fingers one of which is an electrode finger of which the pitch has been made different and the other of which is an electrode finger of which the pitch has not been made different be made almost equal to 0.25λI$_1$+0.25λI$_2$.

According to the above-described unique structure, since the distance between the centers of adjacent electrode fingers one of which is an electrode finger of which the pitch has been made different and the other of which is an electrode finger of which the pitch has not been made different is made almost equal to $0.25\lambda_1 + 0.25\lambda_2$, the continuity of a surface acoustic wave propagating between the electrode finger of which the pitch has been made different and the electrode finger of which the pitch has not been made different is ensured, and the deterioration of an insertion loss is prevented.

The surface acoustic wave apparatus may be configured such that the duty of an electrode finger of which the pitch has been made smaller is smaller than that of electrode fingers in the other portions in the IDT and is substantially equal to or larger than about 0.45. According to the above-described unique structure, since the duty of an electrode finger of which the pitch has been made smaller is smaller than that of electrode fingers in the other portions in the IDT and is substantially equal to or larger than about 0.45, the suppression of the deterioration of an insertion loss is even more reliably achieved.

The advantages described above are achieved in another aspect of preferred embodiments of the present invention through the provision of a surface acoustic wave apparatus of a longitudinally-coupled-resonator type, having a plurality of IDTs each having a plurality of electrode fingers arranged along the propagation direction of a surface acoustic wave on a piezoelectric substrate, wherein the duty of adjacent electrode fingers positioned across the space between at least any two IDTs is smaller than that of electrode fingers at the other portions.

According to the above-described unique structure, since the duty of adjacent electrode fingers positioned across the space between at least any two IDTs is smaller than that of electrode fingers at the other portions, the apparatus has a wide pass band, suppresses the occurrence of electrostatic destruction, and matching in a manufacturing process can be easily implemented.

The surface acoustic wave apparatus may be configured such that the distance between the centers of adjacent electrode fingers positioned across the space between two IDTs is smaller than that (electrode-finger pitch) between the centers of electrode fingers in the other portions. The surface acoustic wave apparatus may have a balanced-unbalanced input and output.

The foregoing advantages are achieved in still another aspect of preferred embodiments of the present invention through the provision of a communication apparatus using any of the above-described surface acoustic wave apparatuses.

According to the above-described unique structure, a surface acoustic wave apparatus having a filter element or a balanced-to-unbalanced conversion function can be made compact especially in a GHz band equal to and higher than 100 MHz. Therefore, the communication apparatus including the surface acoustic wave apparatus can also be made compact. Further, since the used surface acoustic wave apparatus can be made to have a low loss, as described above, the circuit structure can be simplified. Also with this point, the communication apparatus can be made compact.

Other features, elements, characteristics and advantages of the present invention will become more apparent from the following detailed description of preferred embodiments of the present invention with reference to the attached drawings.

DETAILED DESCRIPTION OF THE PREFERRED EMBODIMENTS

Preferred embodiments of the present invention will be described below by referring to FIG. 1 to FIG. 14.

Figure 1:
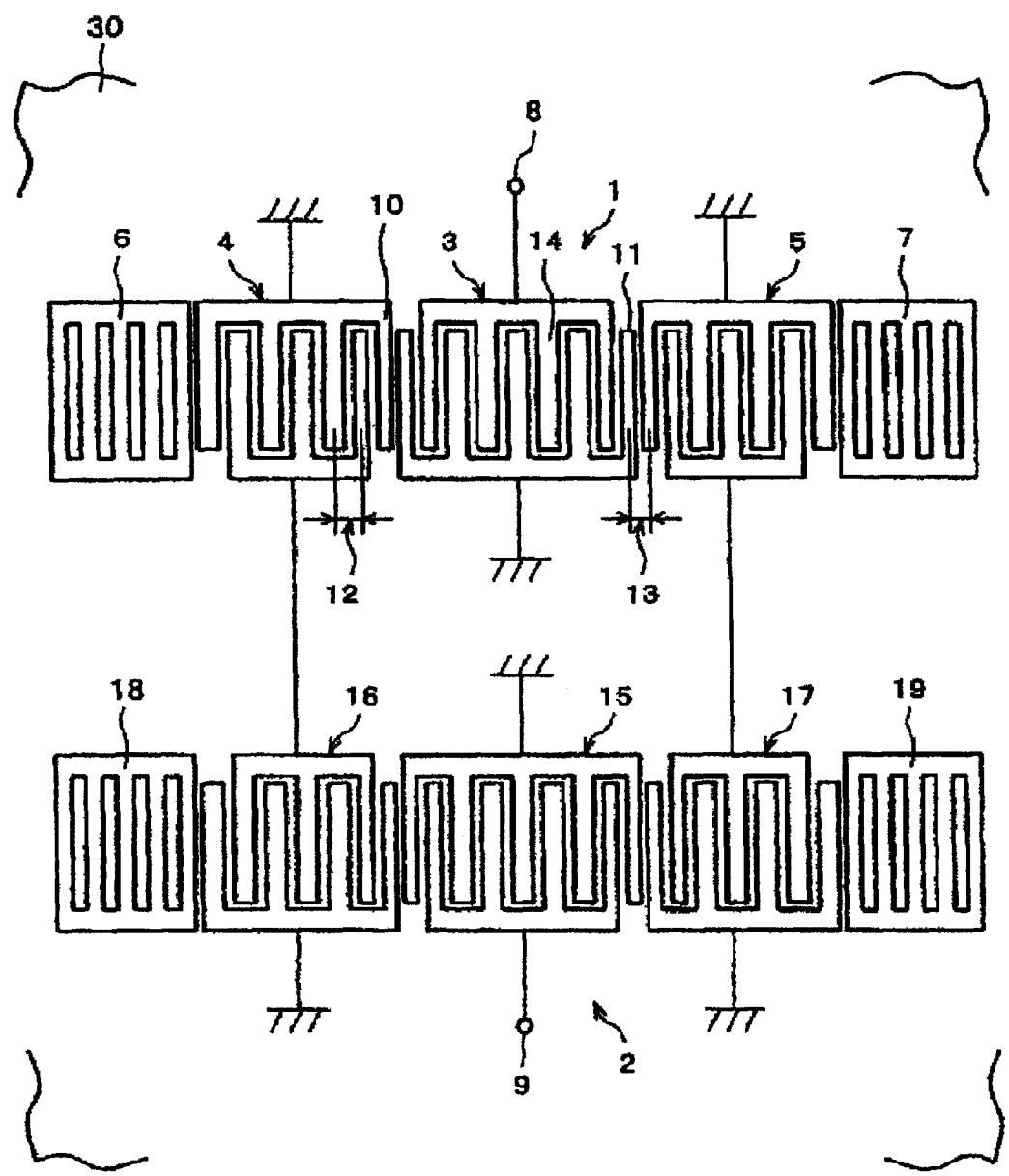
FIG. 1 is an outlined structural view of a surface acoustic wave filter according to a first preferred embodiment of the present invention.
Figure 2:
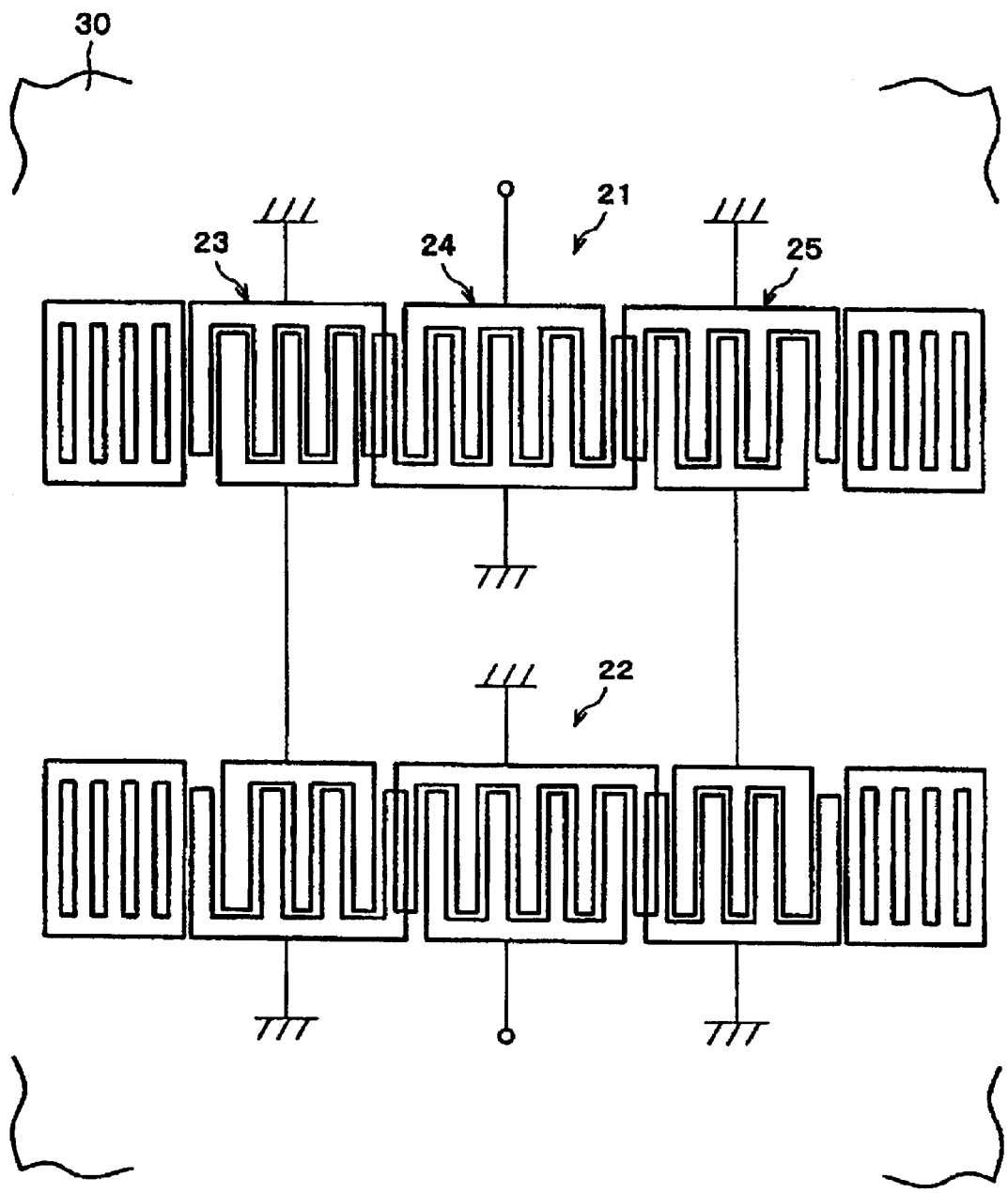
FIG. 2 is an outlined structural view of a surface acoustic wave filter according to a first conventional example, serving as a comparison to the present invention.

FIG. 1 is an outlined view of electrodes of a surface acoustic wave filter (surface acoustic wave apparatus) according to a first preferred embodiment of the present invention. In the first preferred embodiment, a surface acoustic wave filter, preferably for use in an Rx (transmission section) of an extended global system for mobile communications (EGSM) is taken as an example.

In the first preferred embodiment, the surface acoustic wave filter includes Al electrodes disposed on a 40±5-degree Y-cut X-propagation LiTaO$_3$ substrate 30, as shown in FIG. 1. The surface acoustic wave filter has a filter section 1 and a filter section 2 connected in cascade.

The filter sections 1 and 2 are 3-IDT longitudinally-coupled-resonator-type filters and have the same detailed electrode design. The filter sections 1 and 2 have almost parallel propagation directions of the respective surface acoustic waves, and are disposed such that IDTs are symmetrical relative to an intermediate line (virtual line) that is almost parallel to the propagation directions.

In the filter section 1, IDTs 4 and 5 are disposed at the right-hand and left-hand sides (both sides in a direction in which a surface acoustic wave propagates) of an IDT 3, and reflectors 6 and 7 are arranged so as to sandwich the IDTs 3, 4, and 5 from the right-hand and left-hand sides. In the filter section 2, IDTs 16 and 17 are disposed at the right-hand and left-hand sides (both sides in a direction in which a surface acoustic wave propagates) of an IDT 15, and reflectors 18 and 19 are arranged so as to sandwich the IDTs 15, 16, and 17 from the right-hand and left-hand sides. A terminal connected to the IDT 3 functions as an input-signal terminal, and a terminal 9 connected to the IDT 15 functions as an output-signal terminal.

It is clear from FIG. 1 that portions facing each other between the IDT 3 and the IDT 4, and between the IDT 3 and the IDT 5, and some electrode fingers adjacent thereto (close to an electrode finger 10 and an electrode finger 11 in FIG. 1) have a smaller pitch than the other electrode fingers in the IDTs 3, 4, and 5. In FIG. 1, to simplify the figure, the number of electrode fingers is reduced.

In addition, the electrode fingers close to the electrode finger 10 and to the electrode finger 11 preferably have a smaller duty than the other electrode fingers in the IDTs 3, 4, and 5.

Examples of detailed design parameters for the longitudinally-coupled-resonator-type surface acoustic wave filters are shown below, where $\lambda I_2$ indicates the wavelength determined by the pitch of the electrode fingers (such as the electrode finger 10) for which the pitch has been made smaller between IDTs, and $\lambda I_1$ indicates the wavelength determined by the pitch of the other electrode fingers for which the pitch has not been made smaller.

Overlap width: about 35.8$\lambda I_1$

Number of electrode fingers in IDTs (in the order of IDT 4, IDT 3, and IDT 5): 25(4), (4) 27 (4), (4) 25 (the numbers of electrode fingers for which the pitch has been made smaller are indicated in parentheses)

IDT wavelength $\lambda I_1$: about 4.19 μm, $\lambda I_2$: about 3.90 μm

Reflector wavelength $\lambda R$: about 4.29 μm

Number of electrode fingers in a reflector: 100

IDT—IDT interval:
  Interval (interval 12 in FIG. 1) between an electrode finger having a wavelength of $\lambda I_1$ and an electrode finger having a wavelength of $\lambda I_2$ adjacent thereto: about 0.25$\lambda I_1$+0.25$\lambda I_2$
  Interval (interval 13 in FIG. 1) between adjacent electrode fingers having a wavelength of $\lambda I_2$: about 0.5$\lambda I_2$ IDT-reflector interval: about 0.50$\lambda R$ IDT duty:
  Portions (such as an electrode finger 14 in FIG. 1) having the pitch corresponding to the wavelength $\lambda I_1$: about 0.73
  Portions (such as the electrode finger 10 and the electrode finger 11 in FIG. 1) having the pitch corresponding to the wavelength $\lambda I_2$: about 0.60

Reflector duty: about 0.55

Electrode film thickness: about 0.08$\lambda I_1$

For comparison, the structure of a surface acoustic wave filter designed with a conventional technology is shown in FIG. 1 as a first conventional example. In the same ways as in the first preferred embodiment, the surface acoustic wave filter includes Al electrodes disposed on a 40±5-degree Y-cut X-propagation LiTaO$_3$ substrate 30 in the first conventional example.

The surface acoustic wave filter has a filter section 21 and a filter section 22 connected in cascade. The filter sections 21 and 22 are 3-IDT longitudinally-coupled-resonator-type filters and have the same detailed electrode design, in the same way as in the first preferred embodiment. Detailed design parameters for the filter sections 21 and 22 are shown below, where $\lambda I$ indicates the wavelength determined by the pitch of electrode fingers, the pitch being identical.

Overlap width: 56.7$\lambda I$

Number of electrode fingers in IDTs (in the order of IDT 23, IDT 24, and IDT 25): 23, 33, 23

IDT wavelength $\lambda I$: 4.20 μm

Reflector wavelength $\lambda R$: 4.28 μm

Number of electrode fingers in a reflector: 110

IDT—IDT interval: 0.31$\lambda I$

IDT-reflector interval: 0.50$\lambda R$

IDT duty: 0.73

Reflector duty: 0.61

Electrode film thickness: 0.08$\lambda I$

Figure 3:
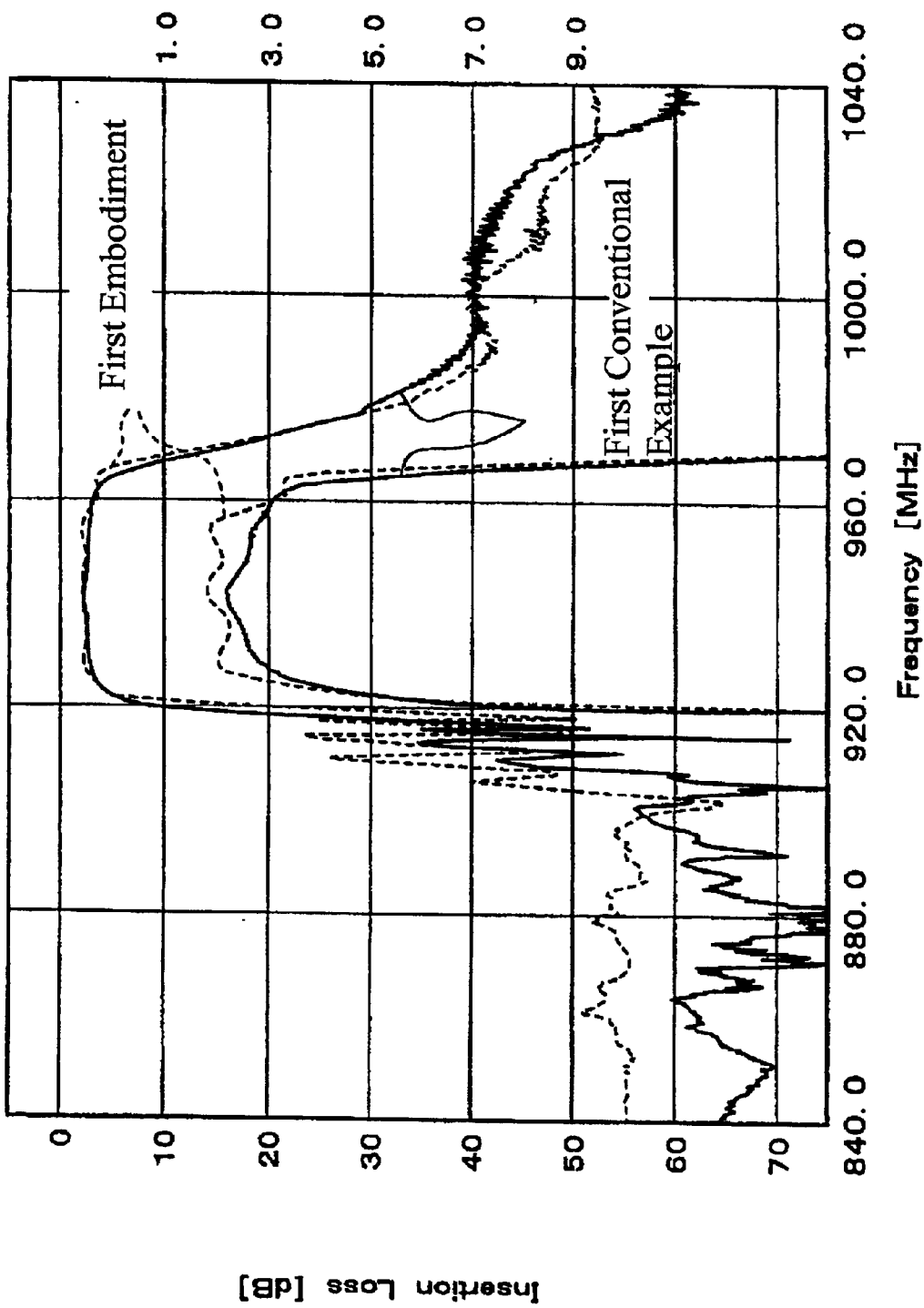
FIG. 3 is a graph showing the insertion losses and pass bands of the surface acoustic wave filters according to the first preferred embodiment and the first conventional example.

FIG. 3 shows frequency characteristics obtained in the first preferred embodiment and in the first conventional example. It is understood that the first preferred embodiment has a largely improved insertion loss in the pass band compared with the first conventional example. The first preferred embodiment has a minimum insertion loss of about 1.8 dB whereas the first conventional example has that of about 2.2 dB. The minimum insertion loss is improved by about 0.4 dB in the first preferred embodiment of the present invention.

The first preferred embodiment has a bandwidth of about 40 MHz from a through level to about 3.4 dB, whereas the first conventional example has the same bandwidth from a through level to about 4.0 dB. This means that an insertion loss of about 0.6 dB is improved in the pass band in the first preferred embodiment of the present invention.

The reason why such a good insertion-loss improvement is obtained will be described below. In the first conventional example, in which the longitudinally-coupled-resonator-type surface acoustic wave filters have three IDTs having no narrowed-pitch electrode fingers, when the pass band is extended, the IDT—IDT terminal is set to about 0.25$\lambda I$ in design to form the pass band with three resonant modes shown in FIG. 4C, the 0-th order mode, the second order mode, and in addition, a resonant mode having strength distribution peaks of a surface acoustic wave at the spaces between IDTs.

In this case, however, since the IDT—IDT interval is set to about 0.25$\lambda I$, an discontinuous portion occurs in the propagation path of a surface acoustic wave. In this discontinuous portion, since a large component is emitted as a bulk wave, a large propagation loss occurs.

When the IDT—IDT interval is set to about 0.5$\lambda I$ to eliminate a discontinuous portion to reduce the component emitted as a bulk wave, three modes cannot be used unlike the case when the IDT—IDT interval is set to about 0.25$\lambda I$, and a wide bandwidth is not obtained.

To solve these two problems, the first preferred embodiment is configured such that the pass band is formed by the use of three resonant modes, and reduces a loss caused by the component emitted as a bulk wave as in the first conventional example.

More specifically, in the first preferred embodiment, the pitch of electrode fingers (such as the electrode fingers 10 and 11) close to the portions located between the IDT 3 and the IDTs 4 and 5 is partially made smaller than that of electrode fingers (such as the electrode finger 14) at the other portions to allow the pass band to be formed by the use of the three resonant modes. In addition, in the first preferred embodiment, the interval (such as the interval 13) between the IDT 3 and each of the IDTs 4 and 5 is preferably about half of the wavelength determined by the pitch of electrode fingers located therearound to reduce a loss caused by the component emitted as a bulk wave as in the first conventional example.

Further, when the cycle of electrode fingers is smaller than the wavelength of a surface acoustic wave propagating a propagation path, since the propagation loss of the surface acoustic wave itself becomes small, there is an advantage that the loss of the surface acoustic wave is reduced at narrowed-pitch electrode fingers.

As a result, in the first preferred embodiment, as shown in FIG. 3, it is understood that a surface acoustic wave filter having a wider bandwidth and a smaller insertion loss than that designed in the first conventional example is obtained.

Since the duty of narrowed-pitch electrode fingers is smaller than that of the other electrode fingers in the first preferred embodiment, the gap between electrode fingers is preferably about 0.78 $\mu$m for the narrowed-pitch electrode fingers and is preferably about 0.57 $\mu$m for the other electrode fingers. The minimum gap between electrode fingers is obtained not at the narrowed-pitch electrode fingers but at the other electrode fingers.

Generally, the deterioration of the dielectric strength of an IDT in a surface acoustic wave filter is determined by the minimum gap between electrode fingers. The smaller the minimum gap is, the more likely the dielectric strength deteriorates. Therefore, in the first preferred embodiment, although narrowed-pitch electrode fingers are used, the minimum gap between electrode fingers is obtained not at the narrowed-pitch electrode fingers but at the other electrode fingers, and a surface acoustic wave filter which is unlikely to have dielectric-strength deterioration is obtained similarly to a case in which narrowed-pitch electrode fingers are not used.

Further, since the gap between narrowed-pitch electrode fingers is larger than that between the other electrode fingers, a missing defect portion or discontinuous portion does not occur at this portion in a manufacturing process. Thus, electrodes can be easily and reliably formed.

When the duty of electrode fingers is made smaller, a larger component is emitted as a bulk wave in a surface acoustic wave propagating on the piezoelectric substrate 30 such as an LT substrate. As a result, a propagation loss is increased and an insertion loss is increased.

Also when only the duty of narrowed-pitch electrode fingers is made small as in preferred embodiments of the present invention, it is anticipated that a propagation loss is increased because a component emitted as a bulk wave is increased at a portion where the narrowed-pitch electrode fingers are located.

The extent to which the duty of the narrowed-pitch electrode fingers can be reduced was examined. While the duty of the narrowed-pitch electrode fingers was made smaller than that of the other electrode fingers in the structure shown in FIG. 1, a change in propagation loss was measured. Actually, since the impedance is changed when the duty is changed, a change in the impedance is adjusted by changing the pitch of the narrowed-pitch electrode fingers.

Figure 5:
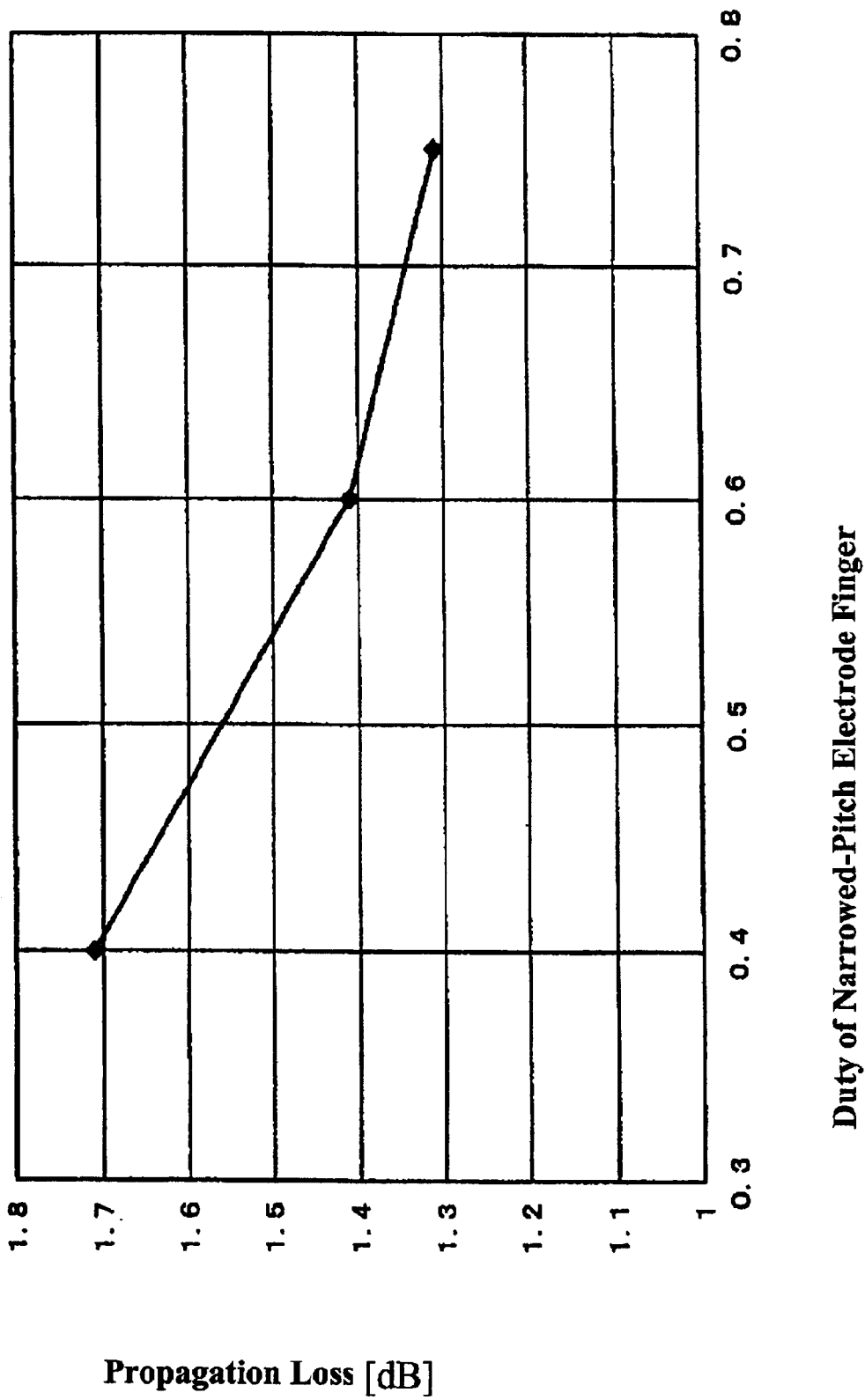
FIG. 5 is a graph showing a propagation loss obtained when the duty of a narrowed-pitch electrode finger is changed in the first preferred embodiment of the present invention.

FIG. 5 shows a propagation loss obtained when the duty is made smaller. The propagation loss is obtained by subtracting a loss caused by impedance mismatching and an ohmic loss caused by the resistance of the electrode fingers from the insertion loss in the pass band.

It is understood from FIG. 5 that the propagation loss is increased to about 1.7 dB when the duty is reduced to about 0.4. The propagation loss in the first conventional example, obtained in the same way, is 1.65 dB. Therefore, it can be said from FIG. 5 that, when the duty is set to about 0.45 or larger, the propagation loss is the same as or smaller than that obtained in the first conventional example.

The propagation loss has almost a constant magnitude in the pass band irrespective of frequencies. Therefore, when the duty is set to about 0.45 or larger, the propagation loss is set to the same as or smaller than that obtained by the conventional design in the pass band. As a result, the insertion loss is made smaller in the pass band.

Figure 6:
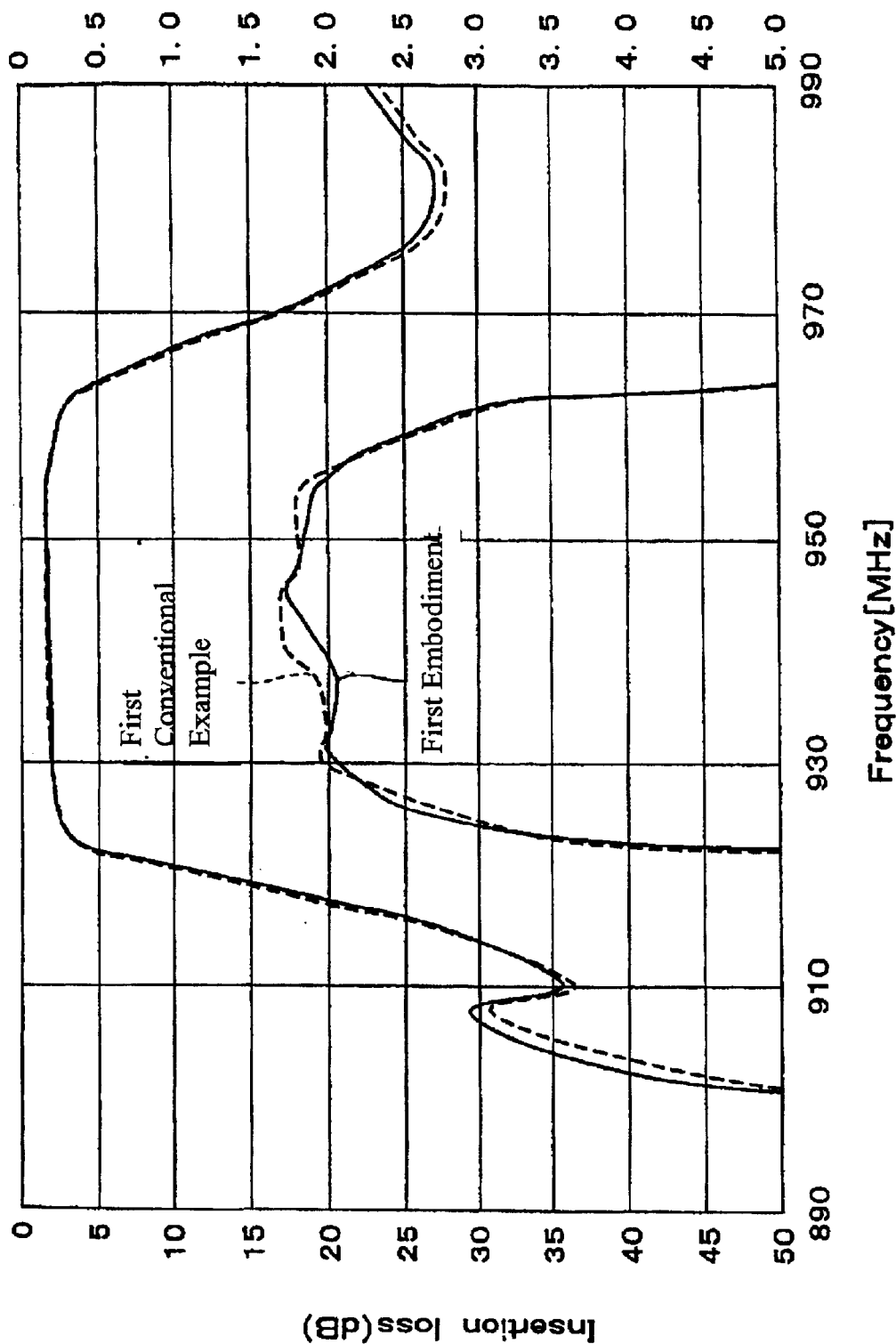
FIG. 6 is a graph showing the frequency characteristics of amplitudes (insertion losses) in the first preferred embodiment and the first conventional example.
Figure 7:
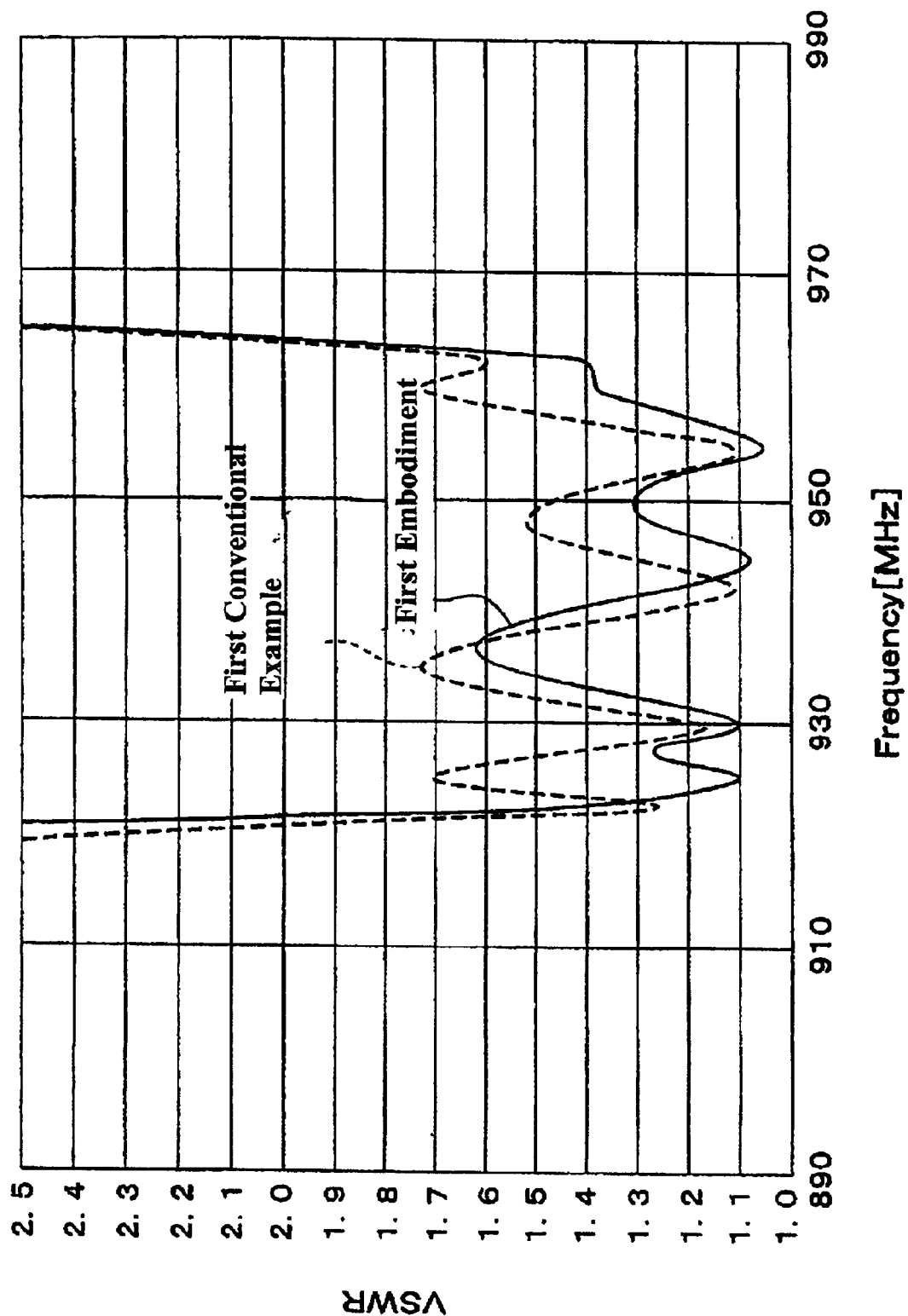
FIG. 7 is a graph showing the frequency characteristics of VSWRs in the first preferred embodiment and the first conventional example.

FIG. 6 and FIG. 7 show the characteristics of the first preferred embodiment and the first conventional example (unlike the first preferred embodiment, the duty of the electrode fingers having a smaller pitch is not made smaller than but is equal to that of the other electrode fingers). FIG. 6 shows the frequency characteristics of amplitudes (insertion losses). FIG. 7 shows the frequency characteristics of voltage standing wave ratios (VSWRs). Compared with the first conventional example, the first preferred embodiment changes the duty of the electrode fingers having a smaller pitch, the pitch, and an overlap width in the following way.

Duty of the electrode fingers (the electrode fingers 10 and 11 shown in FIG. 1) having the pitch corresponding to the wavelength $\lambda I_2$: Smaller than in the first conventional example by about 0.13

Pitch which has been reduced: IDT wavelength $\lambda I_2$: Larger than in the first conventional example by about 0.01 $\mu$m Overlap width: Smaller than in the first conventional example by about 4.7$\lambda I_1$ The reason why the pitch which has been reduced and the overlap width have been changed in addition to the duty is to achieve impedance matching.

As shown in FIG. 7, whereas the first conventional example has a VSWR of 1.73 in the pass band (925 MHz to 960 MHz) of the EGSM-Rx, the first preferred embodiment has a VSWR of about 1.62, which is improved by about 0.11. In addition, since the minimum insertion loss becomes large as shown in FIG. 6, the frequency characteristic of the insertion loss in the pass band is flattened, and the deviation is reduced in the pass band. Since the first preferred embodiment and the first conventional example have almost the same pass bandwidth from the through level to 4 dB, the maximum insertion loss in the pass band, which is an important characteristic, or a manufacturing tolerance which implements the maximum insertion loss does not deteriorate.

As described above, in preferred embodiments of the present invention, in a longitudinally-coupled-resonator-type surface acoustic wave filter having three IDTs or more, the pitch of electrode fingers located at an end portion of an IDT adjacent to another IDT is made smaller than that of the other electrode fingers in the IDT, and in addition, the duty of the electrode fingers having a smaller pitch is made smaller than that of electrode fingers having the other pitch. Therefore, the filter has a wide pass bandwidth, a small insertion loss, and a small VSWR, and does not reduce the dielectric strength. In addition, the electrodes included therein are easily formed.

Figure 8:
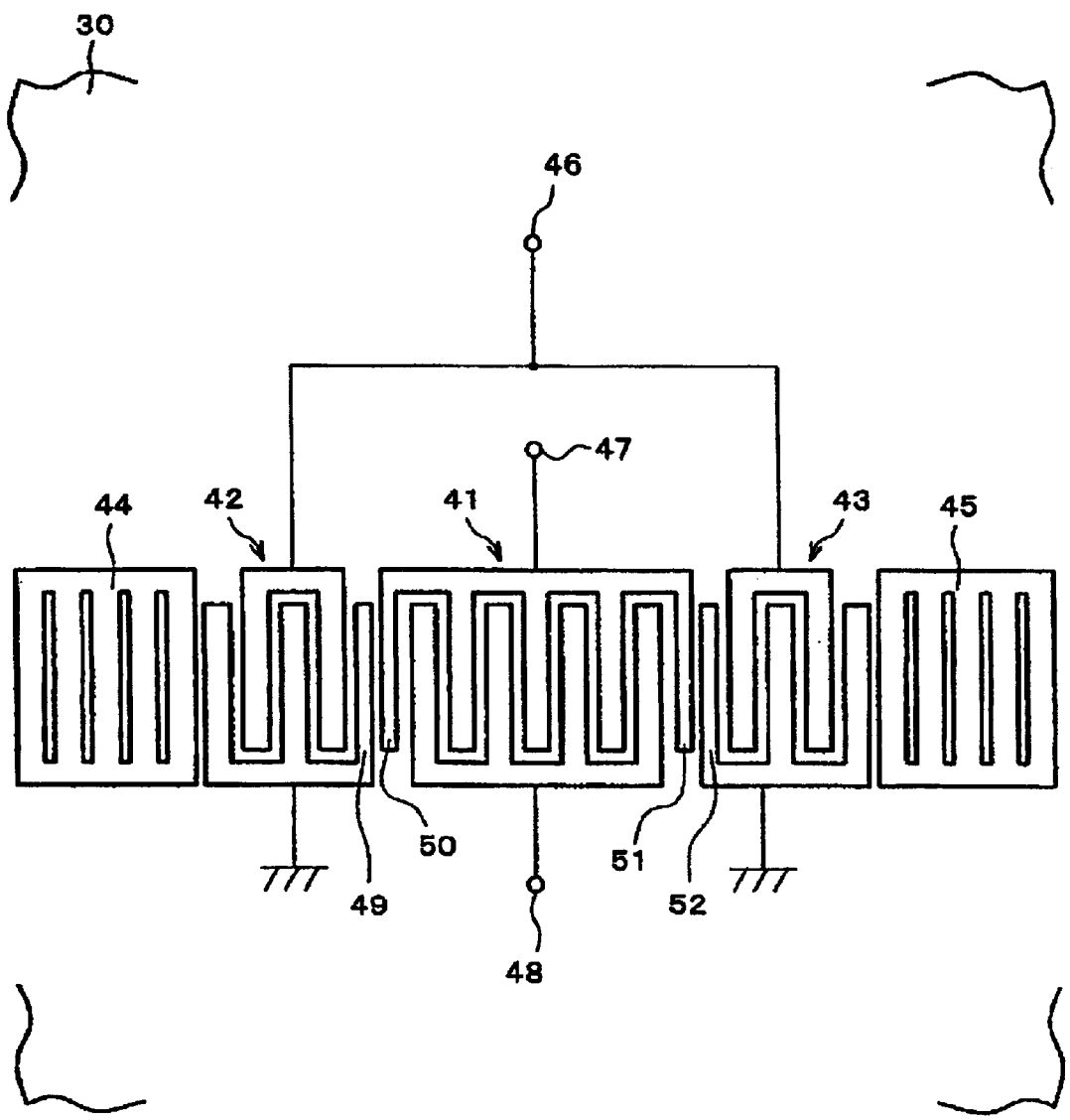
FIG. 8 is an outlined structural view of a surface acoustic wave filter according to a second preferred embodiment of the present invention.
Figure 9:
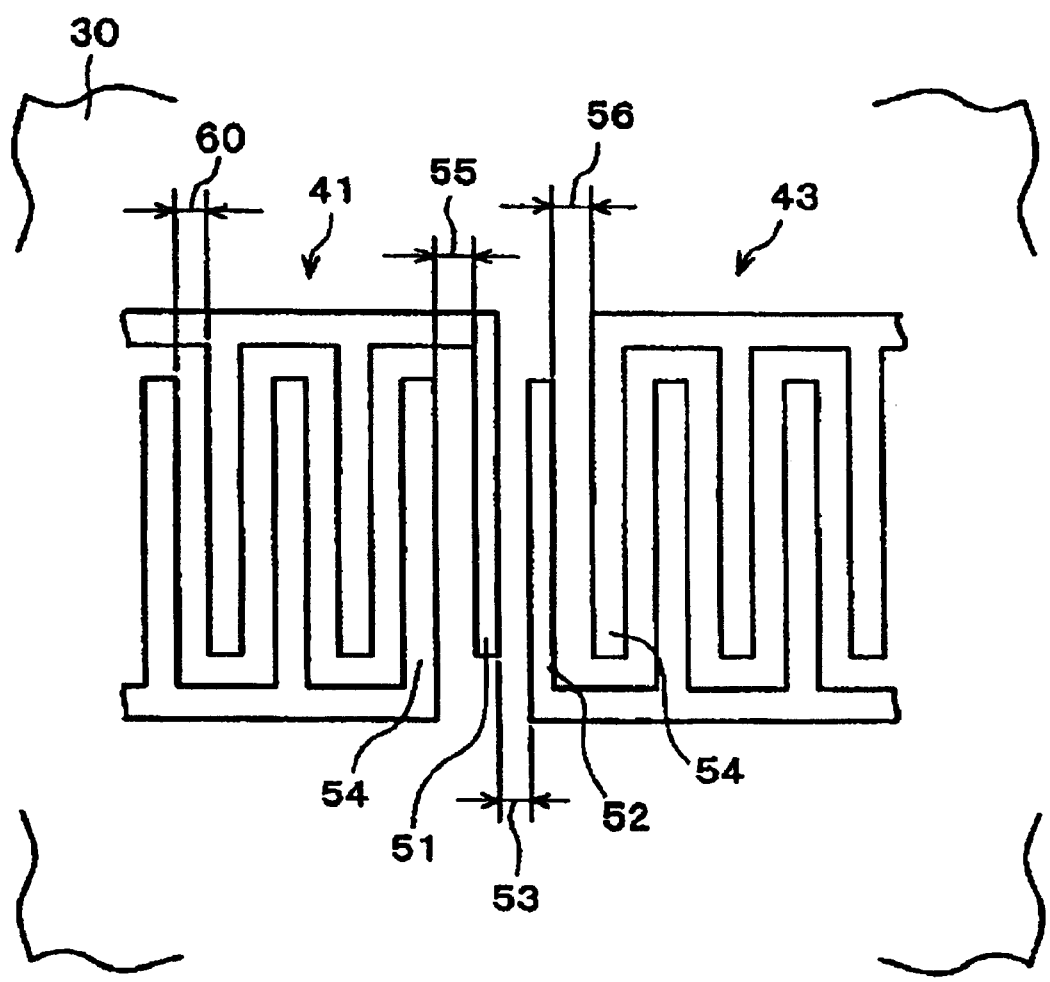
FIG. 9 is an enlarged view of a main section of the surface acoustic wave filter.

A surface acoustic wave filter according to a second preferred embodiment of the present invention will be described below by referring to FIG. 8 and FIG. 9. FIG. 8 and FIG. 9 are outlined structural views of IDTs of the filter. FIG. 8 is an outlined structural view of the entire surface acoustic wave filter, and FIG. 9 is an enlarged view of a portion where IDTs are disposed adjacent to each other.

In the second preferred embodiment, the surface acoustic wave filter includes Al electrodes disposed on a substrate 30. In FIG. 8, IDTs 42 and 43 are disposed in the right-hand and left-hand sides (along a direction in which a surface acoustic wave propagates) of an IDT 41, and reflectors 44 and 45 are arranged so as to sandwich the IDTs 41, 42, and 43. A terminal 46 connected to the IDTs 42 and 43 is an unbalanced input signal terminal. Terminals 47 and 48 connected to electrode-finger sections engaging with each other of the IDT 41 are balanced output signal terminal.

In FIG. 8, the distances between the centers of the outermost adjacent electrodes 49 and 50 of the IDTs 42 and 41, and the outermost adjacent electrodes 51 and 52 of the IDTs 41 and 43 are made smaller than half the wavelength determined by the pitch of the electrode fingers of the IDTs in order to make the bandwidth wider. The center coordinates of the above-described outermost electrode fingers are unchanged (maintained), but only the widths thereof are reduced.

Therefore, as shown in FIG. 9, for example, the gap 53 between the electrode finger 51 and the electrode finger 52 disposed across the space between the IDT 41 and the IDT 43 is substantially equal to or larger than the gap 60 between the other electrode fingers, and the gap 55 between the electrode finger 51 and an electrode finger 54 and the gap 56 between the electrode finger 52 and the electrode finger 54 are larger than the gap 60 between the other electrode fingers.

Figure 10:
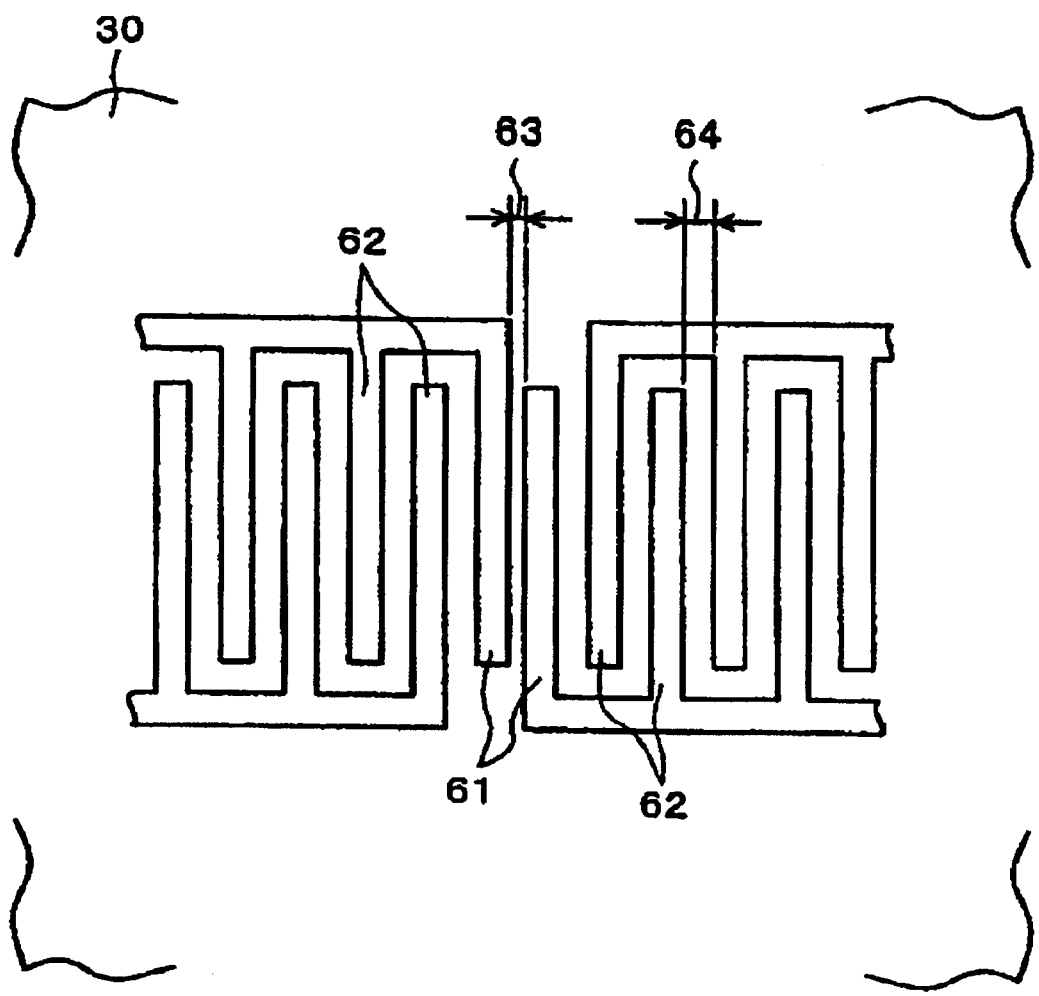
FIG. 10 is an outlined structural view of a surface acoustic wave filter according to a second conventional example, serving as a comparison to the present invention.

For comparison, FIG. 10 is an enlarged view of adjacent IDTs of a surface acoustic wave filter which is a second conventional example. Since the structure thereof other than the portion between the IDTs is the same as that in the second preferred embodiment, a detailed description thereof is omitted. In FIG. 10, the duty of the outermost electrode fingers 61 located across the space between the IDTs is substantially equal to that of the other electrode fingers 62. Therefore, the gap 63 between the outermost electrode fingers 61 is smaller than the gap 64 between the other electrode fingers.

Figure 11:
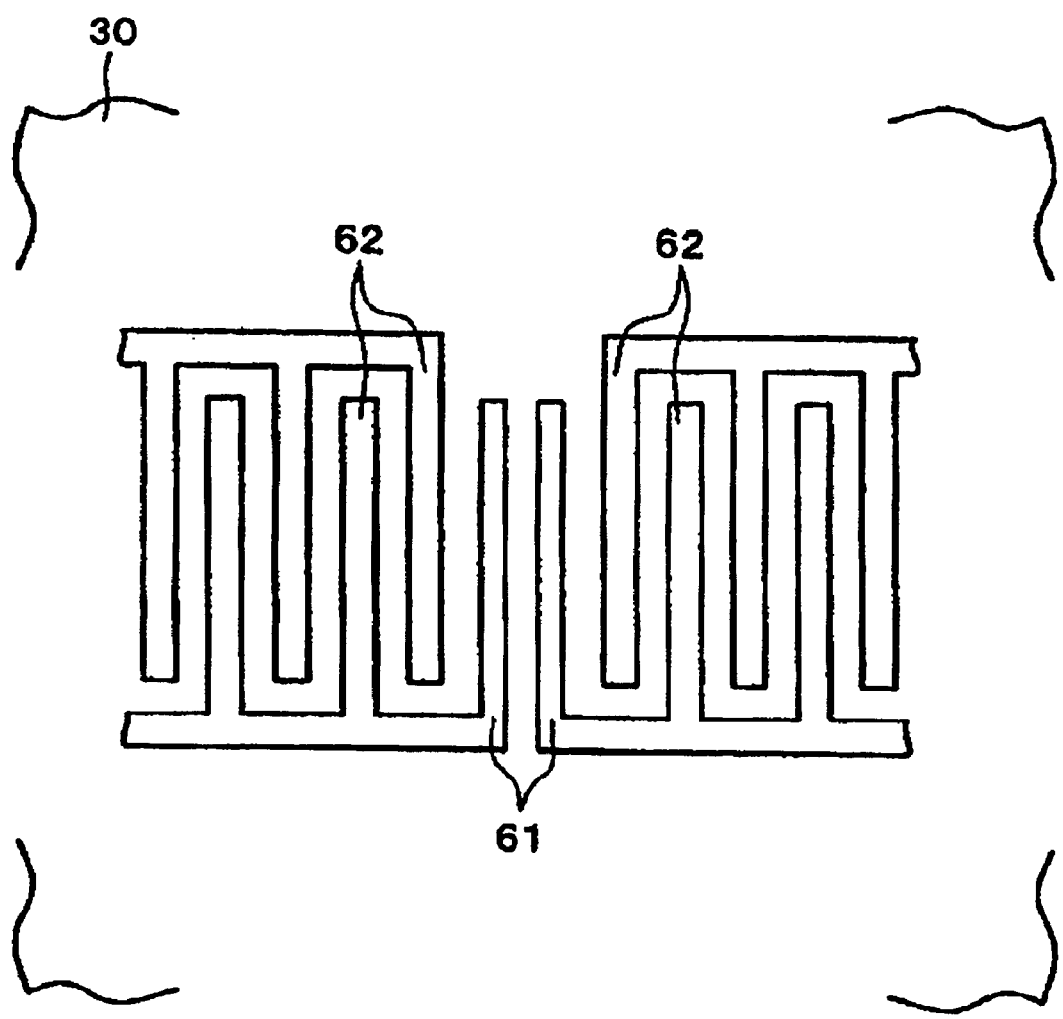
FIG. 11 is an outlined structural view of another surface acoustic wave filter according to the second conventional example.

In the second preferred embodiment, the second conventional example has been taken as a comparison, in which the electrode fingers 61 extended in different directions face, as shown in FIG. 10. The same condition applies even when outermost electrode fingers extended in identical directions face each other, as shown in FIG. 11.

According to the structure of the second preferred embodiment, since the gap between the outermost electrode fingers located at a portion where the IDTs are disposed adjacently is almost equal to or larger than the gap between the other electrode fingers, an Al etching defect is prevented from occurring at this portion in an etching process of manufacturing processes, compared with the second conventional example.

Therefore, in the second preferred embodiment, an acoustic discontinuous portion of a surface acoustic wave does not occur at the gap between the outermost adjacent electrode fingers positioned across the space between IDTs, characteristic deterioration caused by a loss increase is prevented, malfunctions caused by a short-circuit between signal terminals or between a signal terminal and a ground terminal is prevented from occurring, and electrodes are easily and reliably formed in the manufacturing process. In addition, electrostatic destruction does not occur at the gap between the outermost adjacent electrode fingers positioned across the space between IDTs.

In the second preferred embodiment, the gap between IDTs is preferably about half of the wavelength determined by the pitch of electrode fingers or shorter. Even if it is more than half the wavelength, the gap between the outermost adjacent electrode fingers positioned across the space between IDTs is larger than the gap between the other electrode fingers.

Therefore, even when the gap between IDTs, the distance between the centers of adjacent electrode fingers positioned across the space between the IDTs, is about half the wavelength determined by the pitch of electrode fingers or larger, an acoustic discontinuous portion of a surface acoustic wave does not occur at this portion, characteristic deterioration caused by a loss increase does not occur, malfunction caused by a short-circuit between signal terminals does not occur, and electrodes are easily formed in a manufacturing process. In addition, electrostatic destruction does not occur at this portion.

As described above, in preferred embodiments of the present invention, in a longitudinally-coupled-resonator-type surface acoustic wave filter having three IDTs or more, the duty of adjacent electrode fingers positioned across the space between two IDTs is made smaller than that of the other electrode fingers. Therefore, the filter has a wide pass bandwidth, and does not cause electrostatic destruction. In addition, the electrodes thereof are easily formed in a manufacturing process.

Figure 4A:
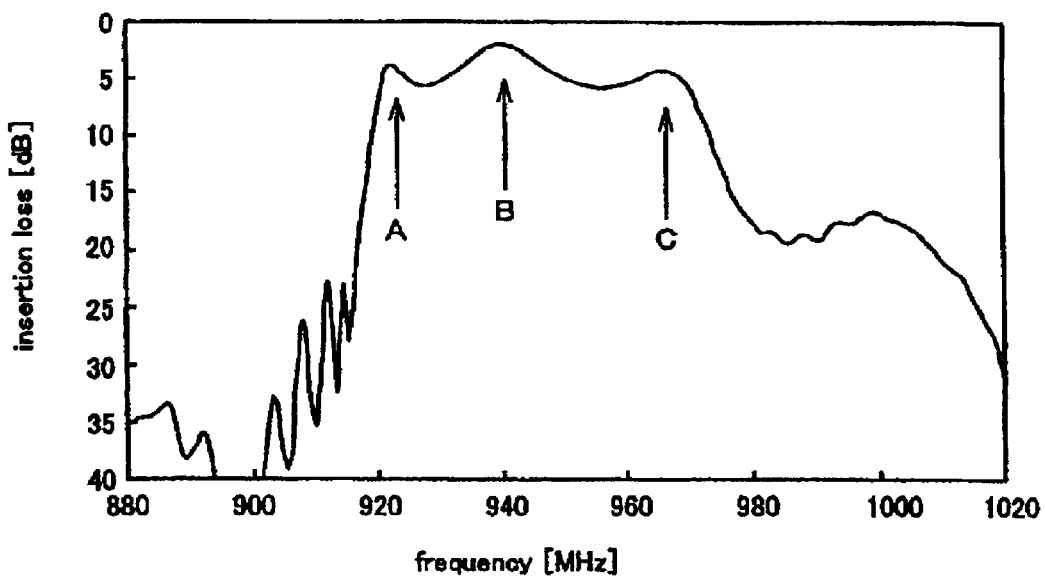
FIG. 4A is a graph showing the frequency relationships among three resonant modes in a wide bandwidth in the surface acoustic wave filter according to preferred embodiments of the present invention.
Figure 4B:
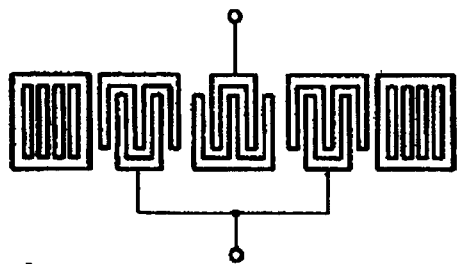
FIG. 4B is an outlined structural view of the surface acoustic wave filter, which has the resonant modes.
Figure 4C:
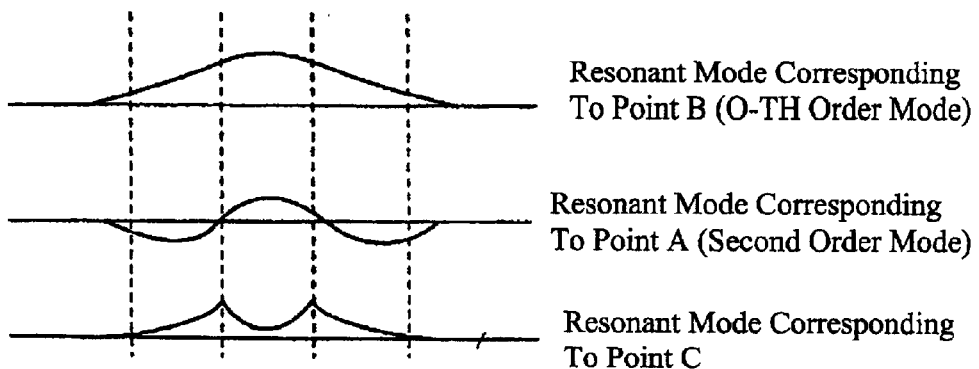
FIG. 4C is a view showing the effective current distributions of the three resonant modes.

As a method for extending the bandwidth of a longitudinally-coupled-resonator-type surface acoustic wave filter, a method has been widely used in which the arrangement of the resonant modes shown in FIG. 4A is optimized by a condition in which electrode fingers are arranged periodically through two adjacent IDTs, more specifically, by shifting the distance (IDT—IDT interval) between the centers of adjacent electrode fingers positioned across the space between two adjacent IDTs from half the wavelength ($\lambda$I) determined from the pitch of IDT electrode fingers, such as that disclosed, for example, in Japanese Unexamined Patent Publication No. Hei-5-267990. Especially when the distance is smaller than about half the wavelength, it is known that a wide-bandwidth surface acoustic wave filter is obtained.

Figure 12:
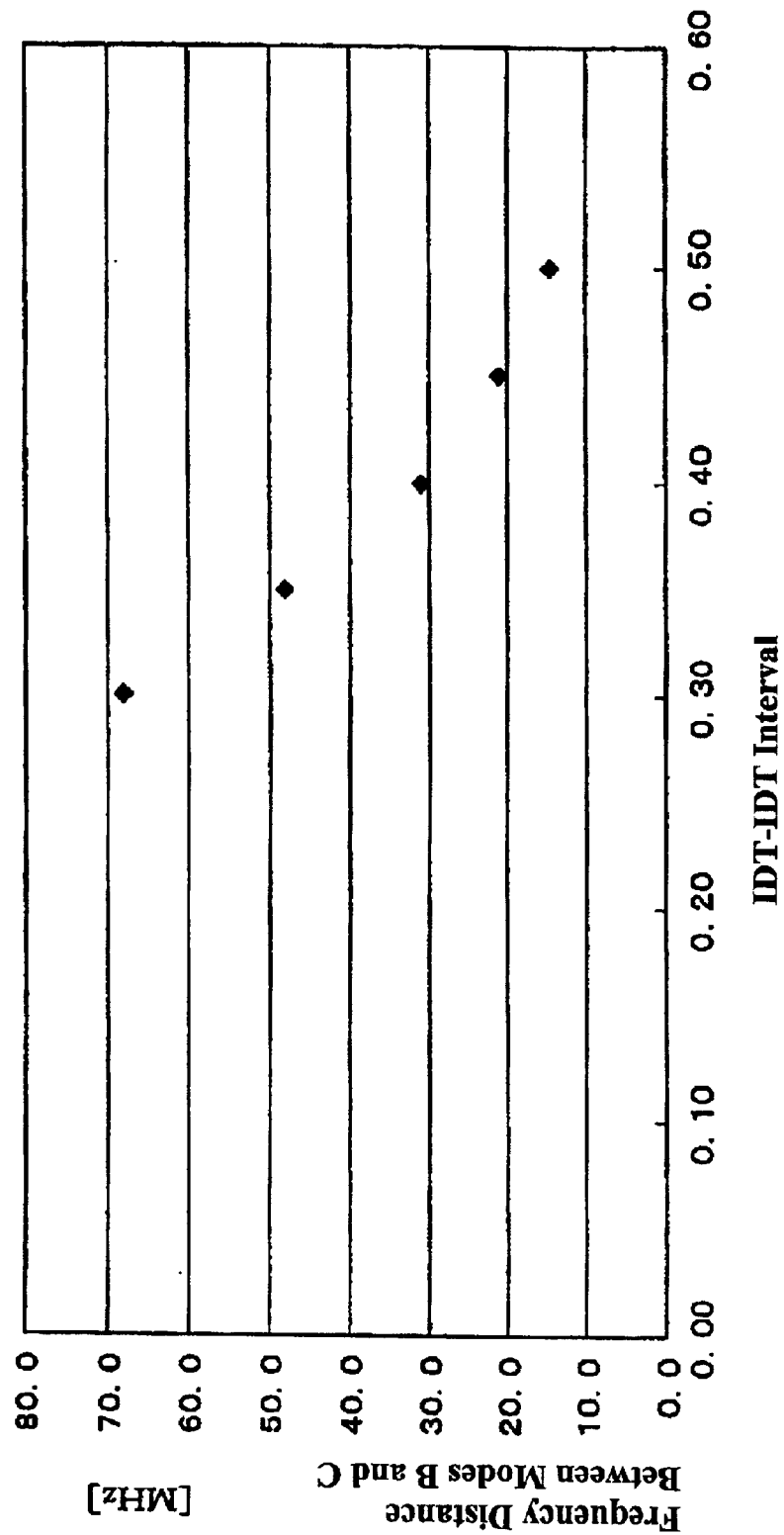
FIG. 12 is a graph showing the relationship between the frequency of each resonant mode shown in FIG. 4 and an IDT—IDT interval.

FIG. 12 shows experimental results of the frequency difference between the B and C modes shown in FIG. 5, obtained when an IDT—IDT interval is made smaller than about 0.5$\lambda$I in a longitudinally-coupled-resonator surface acoustic wave filter for PCS-Rx, having a center frequency of approximately 1,960 MHz.

When the IDT—IDT interval is made smaller than about 0.5$\lambda$I, the frequency difference between the B and C resonant modes of a surface wave becomes larger. As a result, a wider pass bandwidth is obtained.

Figure 13:
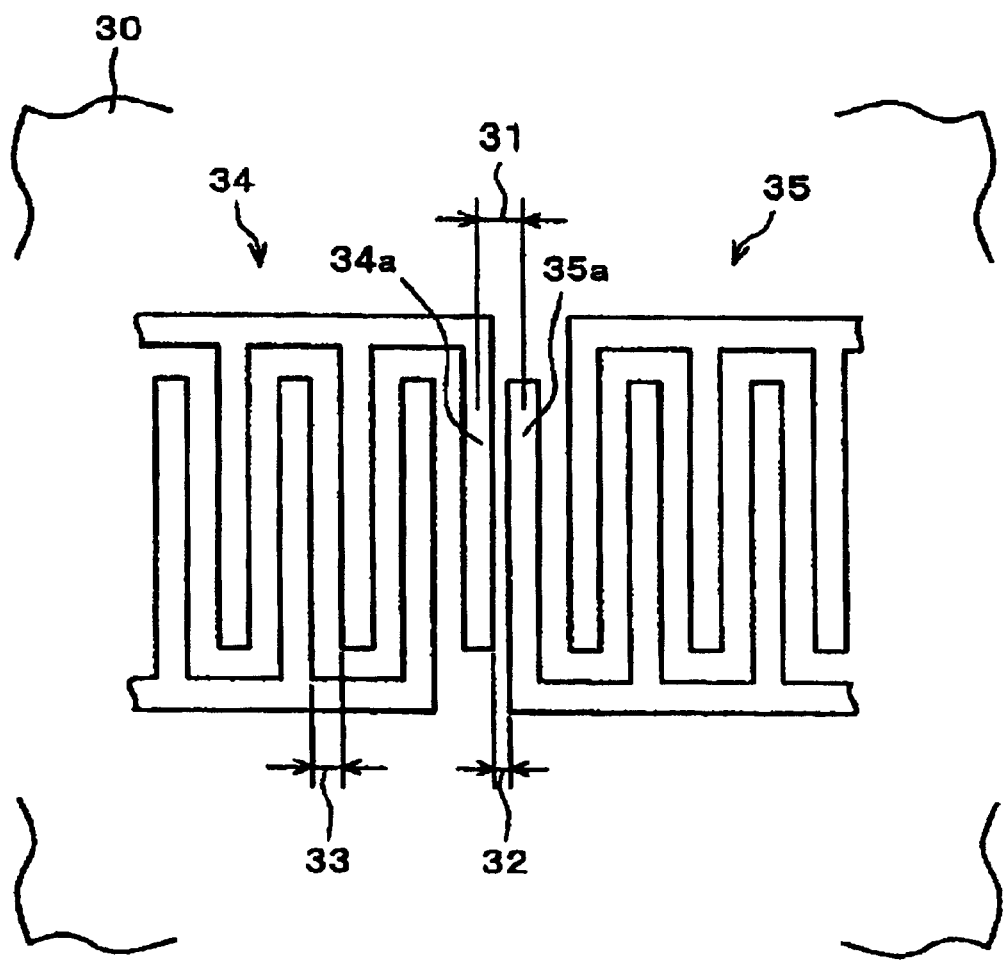
FIG. 13 is an enlarged view of a main section of the IDTs, obtained when the IDT—IDT interval is set to half the wavelength determined by the pitch of electrode fingers or smaller.

FIG. 13 shows the structure of electrodes disposed around the space between IDTs, used when the IDT—IDT interval is made smaller than about 0.5$\lambda$I. Since the distance 31 between the centers of adjacent electrode fingers 34a and 35a positioned across the space between two IDTs 34 and 35 is made smaller than about 0.5λI, only the gap 32 between the electrode fingers at this portion is smaller than the gap 33 of electrode fingers at the other portions.

When the interval between the adjacent electrode fingers positioned across the space between the two IDTs 34 and 35 is made smaller than about half the wavelength determined by the pitch of electrode fingers, however, only the gap between the electrode fingers at this portion is smaller than the gap of electrode fingers at the other portions. Therefore, an Al etching defect is likely to occur at this portion in a manufacturing process.

An Al etching defect at this gap portion leads to the deterioration of the filter characteristic because of a loss increase caused by the generation of an acoustic discontinuous portion of a surface acoustic wave.

Further, when one of the adjacent electrode fingers 34a and 35a functions as a signal electrode and the other functions as a ground electrode, or when one functions as a signal electrode and the other also functions as a signal electrode, an Al etching defect causes a short-circuit between signal terminals, and the surface acoustic wave filter does not work. In addition, since the gap is small, electrostatic destruction is likely to occur at this portion.

In the second preferred embodiment, however, in a longitudinally-coupled-resonator-type surface acoustic wave filter having three IDTs or more, the duty of the outermost electrode fingers positioned across the space between IDTs is made smaller than that of the other electrode fingers. Therefore, the filter has a wide pass bandwidth, and does not cause electrostatic destruction, and machining can be easily performed in a manufacturing process.

Figure 14:
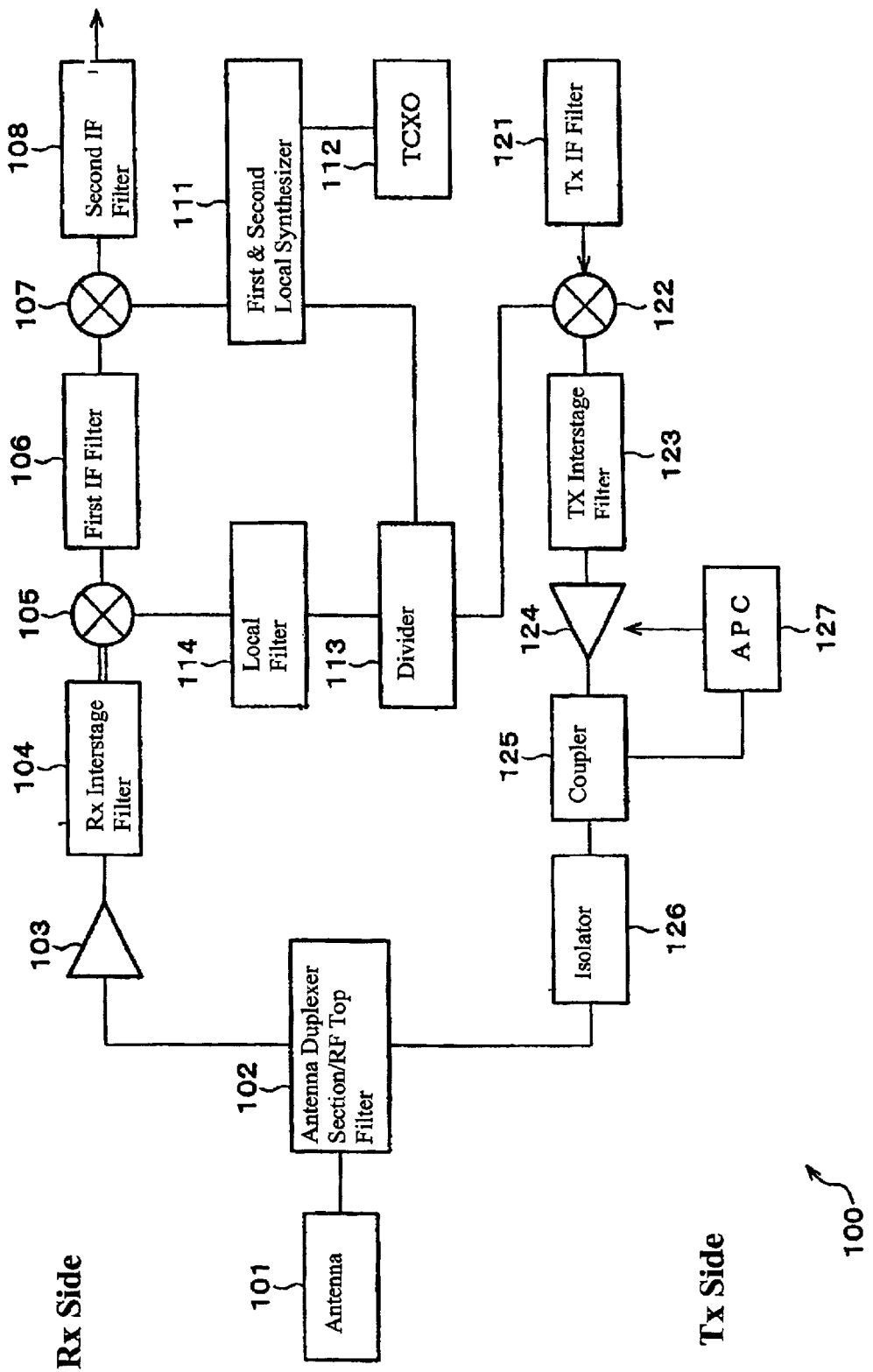
FIG. 14 is a block diagram of a main section of a communication apparatus according to another preferred embodiment of the present invention.

A communication apparatus 100 including the surface acoustic wave apparatuses according to the first and second preferred embodiments will be described next by referring to FIG. 14.

The communication apparatus 100 includes, at a receiver side (Rx side) for receiving, an antenna 101, an antenna duplexer section/RF top filter 102, an amplifier 103, an Rx interstage filter 104, a mixer 105, a first IF filter 106, a mixer 107, a second IF filter 108, a first+second local synthesizer 111, a temperature compensated crystal oscillator (TCXO) 112, a divider 113, and a local filter 114. It is preferred that data be transmitted from the Rx interstage filter 104 to the mixer 105 by the use of balanced signals, as indicated by two lines in FIG. 14, in order to ensure balance.

The communication apparatus 100 also includes, at a transmission side (Tx side) for transmission, the antenna 101 and the antenna duplexer section/RF top filter 102, which are shared with the receiver side, a Tx IF filter 121, a mixer 122, a Tx interstage filter 123, an amplifier 124, a coupler 125, an isolator 126, and an automatic power control (APC) 127.

As the Rx interstage filter 104, the first IF filter 106, the Tx IF filter 121, and the Tx interstage filter 123, the surface acoustic wave apparatuses according to the first and second preferred embodiments can be suitably used.

Since the surface acoustic wave apparatus included in the communication apparatus 100 has a bandwidth that is substantially equal to or wider than that obtained conventionally, has a small insertion loss and a small VSWR, does not cause deterioration of the dielectric strength, and its electrode is easily formed, the communication apparatus is made compact and has a high performance at a low cost. Especially a communication apparatus having a GHz or more pass band can be made compact and have a high performance at a low cost.

As described above, in a surface acoustic wave apparatus according to preferred embodiments of the present invention, the pitch of electrode fingers of at least one IDT among IDTs disposed on a piezoelectric substrate, the electrode fingers being in an end portion adjacent to another IDT, is preferably smaller than a pitch at the other portions, and the duty of the electrode fingers for which the pitch has been set smaller is preferably smaller than that of electrode fingers at the other portions.

Therefore, the apparatus having the above-described unique structure has a bandwidth that is substantially equal to or wider than that obtained by a conventional technology, has a small insertion loss and a small VSWR, and does not cause deterioration of the dielectric strength, and its electrodes are easily formed.

As described above, another surface acoustic wave apparatus according to preferred embodiments of the present invention is a longitudinally-coupled-resonator-type surface acoustic wave apparatus in which a plurality of IDTs each having a plurality of electrode fingers is arranged along the propagation direction of a surface acoustic wave on a piezoelectric substrate, and the duty of adjacent electrode fingers positioned across the space between at least any two IDTs is smaller than that of electrode fingers at the other portions.

Therefore, since the duty of adjacent electrode fingers positioned across the space between at least any two IDTs is smaller than that of electrode fingers at the other portions, the apparatus with the above-described unique structure has advantages that a wide bandwidth is provided, electrostatic destruction is prevented from occurring, and machining is easily performed in a manufacturing process.

As described above, a communication apparatus according to another preferred embodiment of the present invention includes the surface acoustic wave apparatus according to the other preferred embodiments of the present invention. Therefore, because the used surface acoustic wave apparatus has a bandwidth that is substantially equal to or wider than that obtained by a conventional technology, has a small insertion loss and a small VSWR, and does not cause deterioration of the dielectric strength, and its electrodes are easily formed, the communication apparatus with the above-described unique structure has a higher performance at a lower cost.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave apparatus comprising:
   a piezoelectric substrate;
   a plurality of interdigital transducers each having a plurality of electrode fingers and being arranged along the propagation direction of a surface acoustic wave propagated on the piezoelectric substrate; wherein
   in at least one of the plurality of interdigital transducers, the pitch of one of the electrode fingers located in an end portion thereof facing another of the plurality of interdigital transducers is smaller than that of electrode fingers at the other portions of the at least one of the plurality of interdigital transducers; and
   the duty of the electrode finger of which the pitch is made smaller is smaller than that of the electrode fingers at the other portions of the at least one of the plurality of interdigital transducers.

2. A surface acoustic wave apparatus according to claim 1, wherein adjacent pairs of the plurality of interdigital transducers are provided with an electrode finger having a different pitch from the other electrode fingers, and a distance between centers of the adjacent pairs of electrode fingers positioned across the space between two interdigital transducers is made substantially equal to $0.5\lambda I_2$ where $\lambda I_2$ indicates the wavelength determined by the pitch of the electrode fingers of which the pitch has been made different, and $\lambda I_1$ indicates the wavelength determined by the pitch of the other electrode fingers.

3. A surface acoustic wave apparatus according to claim 2, wherein, in the at least one interdigital transducer in which the pitch of the electrode finger located in the end portion facing the another interdigital transducer is made different from that of the other electrode fingers in the interdigital transducer, the distance between the centers of adjacent electrode fingers one of which is an electrode finger of which the pitch has been made different and the other of which is an electrode finger of which the pitch has not been made different is substantially equal to $0.25\lambda I_1 + 0.25\lambda I_2$.

4. A surface acoustic wave apparatus according to claim 1, wherein one of adjacent pairs of the plurality of interdigital transducers is provided with an electrode finger having a different pitch from the other electrode fingers thereof, and the distance between centers of the adjacent pairs of the plurality of electrode fingers positioned across the space between two interdigital transducers is substantially equal to $0.25\lambda I_1 + 0.25\lambda I_2$, where $\lambda I_2$ indicates the wavelength determined by the pitch of the electrode fingers of which the pitch has been made different, and $\lambda I_1$, indicates the wavelength determined by the pitch of the other electrode fingers.

5. A surface acoustic wave apparatus according to claim 4, wherein, in the at least one of the plurality of interdigital transducers in which the pitch of the electrode finger located in the end portion facing the another interdigital transducer is made different from that of the other electrode fingers in the interdigital transducer, the distance between the centers of adjacent electrode fingers one of which is an electrode finger of which the pitch has been made different and the other of which is an electrode finger of which the pitch has not been made different is substantially equal to $0.25\lambda I_1 + 0.25\lambda I_2$.

6. A surface acoustic wave apparatus according to claim 1, wherein the duty of an electrode finger of which the pitch has been made smaller is smaller than that of electrode fingers in the other portions in the at least one of the plurality of interdigital transducers and is substantially equal to or larger than 0.45.

7. A surface acoustic wave apparatus according to claim 1, wherein a balanced-unbalanced input and output is provided.

8. A surface acoustic wave apparatus according to claim 1, wherein the surface acoustic wave apparatus is a longitudinally-coupled-resonator type.

9. A communication apparatus using a surface acoustic wave apparatus according to claim 1.

10. A surface acoustic wave apparatus comprising:

a piezoelectric substrate;

a plurality of interdigital transducers each having a plurality of electrode fingers and being arranged along the propagation direction of a surface acoustic wave propagated on the piezoelectric substrate; wherein the duty of adjacent electrode fingers positioned across the space between at least any two of the plurality of interdigital transducers is smaller than that of electrode fingers at the other portions thereof.

11. A surface acoustic wave apparatus according to claim 10, wherein a distance between centers of adjacent electrode fingers positioned across the space between two interdigital transducers is smaller than that between centers of electrode fingers in the other portions.

12. A surface acoustic wave apparatus according to claim 10, wherein a balanced-unbalanced input and output is provided.

13. A surface acoustic wave apparatus according to claim 10, wherein the surface acoustic wave apparatus is a longitudinally-coupled-resonator type.

14. A communication apparatus using a surface acoustic wave apparatus according to claim 10.

* * * * *